(12) United States Patent
Kavalieros et al.

(10) Patent No.: US 7,598,560 B2
(45) Date of Patent: Oct. 6, 2009

(54) HETERO-BIMOS INJECTION PROCESS FOR NON-VOLATILE FLASH MEMORY

(76) Inventors: Jack T. Kavalieros, 14260 NW. Belle Ct., Portland, OR (US) 97229; Suman Datta, 16659 NW. Talkingstick Way, Beaverton, OR (US) 97006; Robert S. Chau, 8875 SW. 171$^{st}$ Ave., Beaverton, OR (US) 97007; David L. Kencke, 3839 NW. 163$^{rd}$ Ter., Beaverton, OR (US) 97006

( * ) Notice: Subject to any disclaimer, the term of this patent is extended or adjusted under 35 U.S.C. 154(b) by 278 days.

(21) Appl. No.: 11/731,162

(22) Filed: Mar. 30, 2007

(65) Prior Publication Data
US 2008/0237735 A1    Oct. 2, 2008

(51) Int. Cl.
*H01L 29/76* (2006.01)
*H01L 29/788* (2006.01)

(52) U.S. Cl. ............... 257/314; 257/326; 257/E29.129

(58) Field of Classification Search ............. 257/314, 257/315, 326, 351, 361, 370, E29.129, E29.3
See application file for complete search history.

(56) References Cited

U.S. PATENT DOCUMENTS

2006/0186457 A1*    8/2006    Burnett et al. ............. 257/315

* cited by examiner

*Primary Examiner*—Hoai V Pham
(74) *Attorney, Agent, or Firm*—Rahul D. Engineer

(57) ABSTRACT

A hetero-BiMOS injection system comprises a MOSFET transistor formed on a substrate and a hetero-bipolar transistor formed within the substrate. The bipolar transistor can be used to inject charge carriers into a floating gate of the MOSFET transistor. This is done by operating the MOSFET transistor to form an inversion layer in its channel region and operating the bipolar transistor to drive minority charge carriers from the substrate into a floating gate of the MOSFET transistor. The substrate provides a silicon emitter and a silicon germanium containing base for the bipolar transistor. The inversion layer provides a silicon collector for the bipolar transistor.

6 Claims, 4 Drawing Sheets

HETERO-BIMOS INJECTION PROCESS FOR NON-VOLATILE FLASH MEMORY

BACKGROUND

Traditional nonvolatile memory such as "NOR" type Flash relies on a process called channel hot electron injection (CHEi) to charge up a floating gate, such as a polysilicon or nitride layer sandwiched between two oxide layers in a tri-layer stack. The CHEi process occurs near the drain and/or source regions of a MOSFET. During this charging cycle (i.e., a "write cycle"), electrons are accelerated from the source region to the drain region by a horizontal electric field induced by a drain region bias $V_{DS}$. These electrons then impact ionize an electron-hole pair in the depletion region of the drain. The hole generated recombines in the substrate while the electron may be accelerated further by the vertical field across the gate and be injected into the floating gate. Unfortunately, the CHEi process is rather inefficient since only one in roughly a million electrons end up making the transition through the gate oxide and because the injection is localized to only the drain region.

As integrated circuit device dimensions continue to scale down, the scaling of NOR Flash memory devices requires that the off-state drain current be maintained in ever larger arrays to meet power requirements. This requirement is most affected when a bit line is selected and a high bias placed on it for CHEi programming. The unselected word lines for memory cells that share the selected bit line are kept low to keep their floating gates below threshold, but the high drain field required for CHEi programming of the one selected memory cell causes drain induced barrier lowering leakage in many of the unselected memory cells. To reduce leakage, channel doping remains as high as possible and gate length scaling is limited. The drain turn-off leakage metric therefore limits scaling of the memory cell size and therefore limits how dense the final memory cell array can be made. Accordingly, a method that can maintain and improve the speed of CHEi programming (i.e., improve injection efficiency) but reduce the drain field in unselected memory cells is highly desirable.

DETAILED DESCRIPTION

Described herein are systems and methods of charging a floating gate of a NOR transistor. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Implementations of the invention introduce a process for injecting electrons into a floating gate structure that can be used in lieu of conventional channel hot electron (CHE) injection methods. In accordance with implementations of the invention, a hetero-BiMOS process is used to charge the floating gate of a NOR flash memory cell transistor. The hetero-BiMOS process of the invention implements a hetero-bipolar injection mechanism, as described below, that enables uniform injection across the transistor channel at electric fields lower than that required by CHE processes or conventional Fowler-Nordheim tunneling. The hetero-bipolar injection mechanism uses a combination of silicon and silicon germanium to increase electron injection efficiency at the lower gate and drain electric fields, thereby enabling further scaling of memory cells and improving reliability. The result is lower off-state leakage and reduced power dissipation.

Figure 1A:
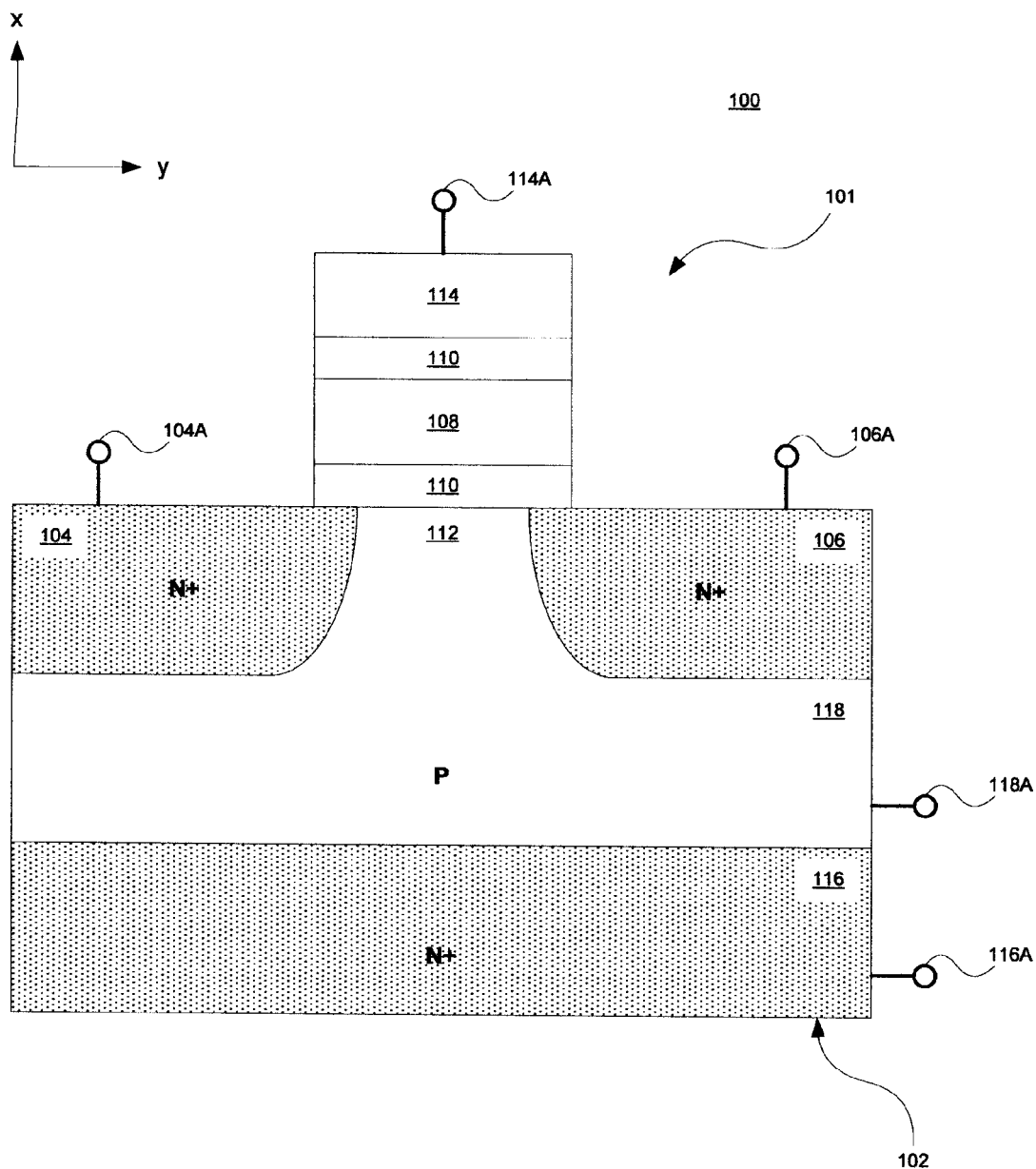
FIG. 1A is a hetero-BiMOS injection system according to an implementation of the invention that is not in operation.
Figure 2A:
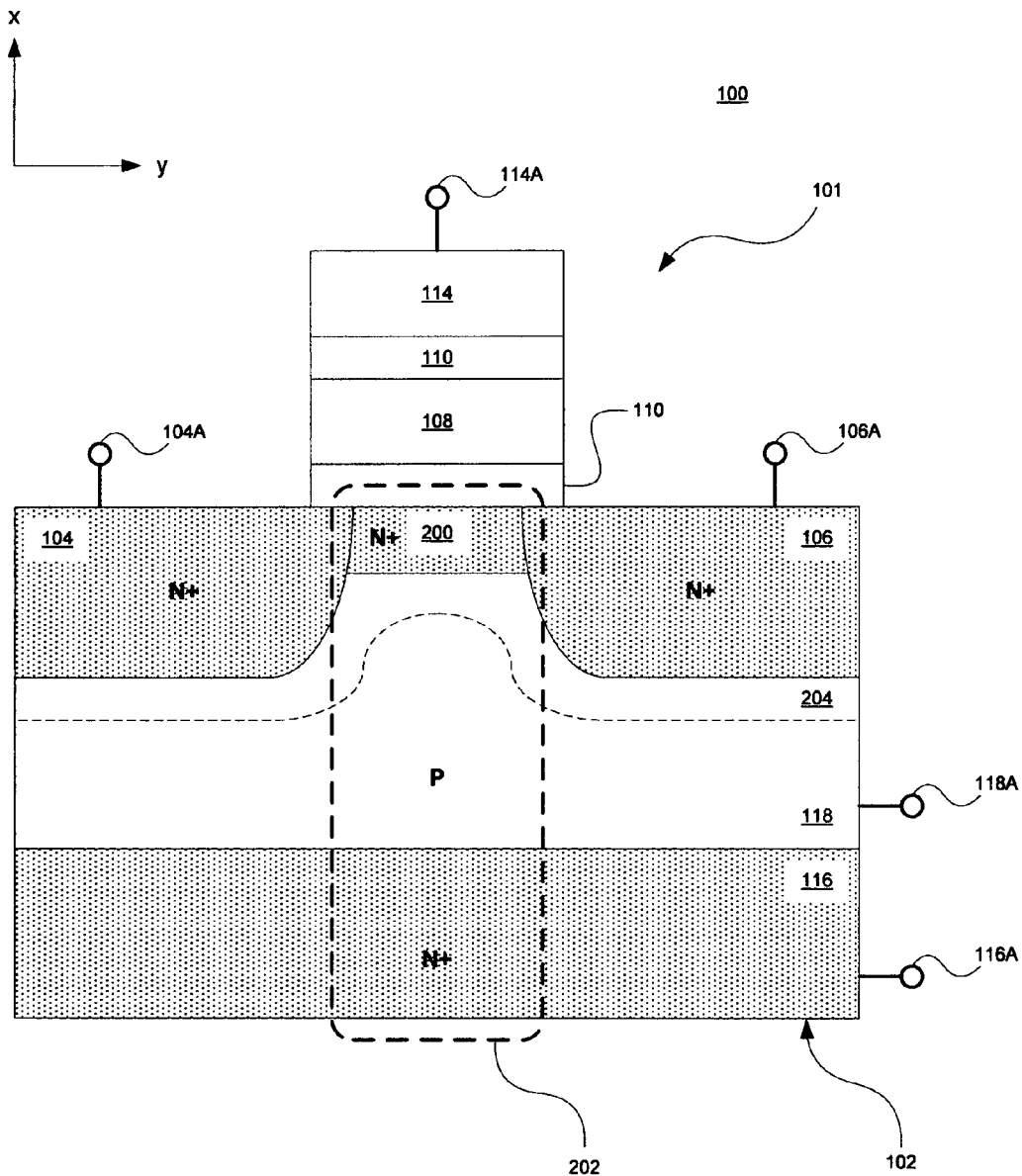
FIG. 2A is a hetero-BiMOS injection system according to an implementation of the invention that is operational.

FIG. 1A illustrates the structure of a hetero-BiMOS injection system 100 according to an implementation of the invention. In FIG. 1A, the hetero-BiMOS injection system 100 is not in operation, in other words, no voltages are being applied. FIG. 2A below illustrates the changes that occur when the hetero-BiMOS injection system 100 becomes operational.

The primary elements of the hetero-BiMOS injection system 100 shown in FIG. 1A are a floating gate metal-oxide-semiconductor field-effect transistor (MOSFET) 101, which may function as a non-volatile NOR memory cell, and a multi-layer substrate 102 that functions as a bipolar transistor under the appropriate conditions. The substrate 102 may be a semiconductor substrate upon which a complete integrated circuit may be built. As will be explained below, the bipolar transistor functionality of the multi-layer substrate 102 enables the hetero-BiMOS injection system 100 to accelerate charge carriers and inject them into the floating gate of the floating gate MOSFET 101 using gate-induced electric fields lower than that required by CHE or conventional Fowler-Nordheim tunneling.

As shown in FIG. 1A, the floating gate MOSFET 101 includes two diffusion regions, a source region 104 and a drain region 106. These diffusion regions are formed in portions of the substrate 102 using conventional transistor fabrication processes, for instance, doping the appropriate portions of the substrate 102 using an ion implantation technique. In implementations of the invention, the source region 104 and the drain region 106 may be heavily doped N-type regions (i.e., N+ regions). The source region 104 and drain region 106 may include terminals 104A and 106A through which a voltage may be applied.

The floating gate MOSFET 101 further includes a tri-layer floating gate stack with a floating gate 108 formed between two oxide layers 110. The floating gate 108 is formed of polysilicon, nitride, or metal and is where the memory cell stores charge carriers, such as electrons. The floating gate 108 may have a thickness that ranges from 200 Angstroms (Å) to 800 Å. If a nitride is used in floating gate 108, the specific type of nitride used may include, but is not limited to, silicon nitride. If a metal is used, the metal may include, but is not limited to, hafnium, zirconium, titanium, tantalum, aluminum, metal carbides, titanium carbide, zirconium carbide, tantalum carbide, hafnium carbide, aluminum carbide, ruthenium, palladium, platinum, cobalt, nickel, conductive metal oxides and conductive metal nitrides.

The oxide layers 110 trap the charge carriers in the floating gate 108. The oxide layers 110 may each have a thickness that ranges from 50 Å to 150 Å and may be formed from most conventional oxides such as silicon dioxide or a high-k dielectric material. For instance, high-k dielectrics that may be used here include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

As shown in FIG. 1A, a portion of the substrate 102 subjacent to the tri-layer floating gate stack forms a channel region 112 for the MOSFET 101. Furthermore, a control gate 114 may be formed on top of the tri-layer floating gate stack. The control gate 114 may include a terminal 114A.

As is well known in the art, the control gate 114 is used during operation of the MOSFET 101. For instance, when a voltage is applied between the control gate terminal 114A and the source region terminal 104A, an electric field may be generated that creates an inversion layer (shown in FIG. 2A) in the channel region 112. The inversion layer that is formed is of the same type as the source region 104 and the drain region 106 (e.g., N+ type), so it provides a conduit through which current may pass. In implementations of the invention, the control gate 114 may be formed using the same materials described above to form the floating gate, such as polysilicon, nitrides, and metals. Also, the control gate 112 may have a thickness that ranges from 500 Å to 2000 Å.

Turning to the substrate 102, in accordance with implementations of the invention, there are at least two layers present. The first layer is a silicon emitter layer 116 that is heavily doped; for instance, the emitter layer 116 may be heavily doped N-type. Since the emitter layer 116 is heavily doped, this is denoted herein as N+. Because implementations of the invention use the substrate 102 as a bipolar transistor, a terminal 116A is required that is coupled to the emitter layer 116. In implementations of the invention, the emitter layer 116 is generally formed from a bulk substrate, such as a bulk silicon substrate.

The second layer is a base layer 118 that is not heavily doped and has a doping that is complementary to the doping of the emitter layer 116. For instance, if the emitter layer 116 is N+ doped, then the base layer 118 may be P doped. Similarly, if the emitter layer 116 is P+ doped, then the base layer 118 may be N doped. Again, to use the substrate 102 as a bipolar transistor, a terminal 118A is required that is coupled to the base layer 118. The base layer 118 is sandwiched between the emitter layer 116 and the MOSFET 101. As will be recognized by those of skill in the art, the source region 104 and the drain region 106 were formed by heavily doping portions of the base layer 118. Furthermore, the base layer 118 provides the channel region 112.

In accordance with implementations of the invention, the base layer 118 is formed from epitaxially deposited silicon germanium. Unlike conventional bipolar transistors where the base layer is formed from silicon, the use of silicon germanium in the hetero-BiMOS injection system 100 provides a smaller bandgap and improves injection efficiency relative to silicon. The silicon germanium base layer 118 may have a thickness that is 200 Å or less.

The germanium fraction may range up to 50% in at least a portion of the base layer 118. In one implementation, the germanium concentration may be graded such that a lower germanium fraction is present proximate to the emitter layer 116 and a higher germanium fraction is present proximate to the channel region 112 of MOSFET 101 to improve injection efficiency. In implementations of the invention, the germanium fraction may then decrease to substantially 0% in the portion of the base layer 118 that forms the channel region 112, thereby providing a silicon channel region 112. As such, the silicon germanium portion of the base layer 118 may be sandwiched between the silicon emitter layer 116 and the silicon channel region 112.

As will be known to those of skill in the art, an NPN bipolar transistor requires three regions to operate, an N+ doped emitter region, a P doped base region, and an N+ doped collector region. In the hetero-BiMOS injection system 100 shown in FIG. 1A, the emitter layer 116 forms the N+ doped emitter region and the base layer 118 forms the P doped base region. In FIG. 1A, however, an N+ doped collector region is not present so a bipolar transistor is not formed.

Figure 1B:
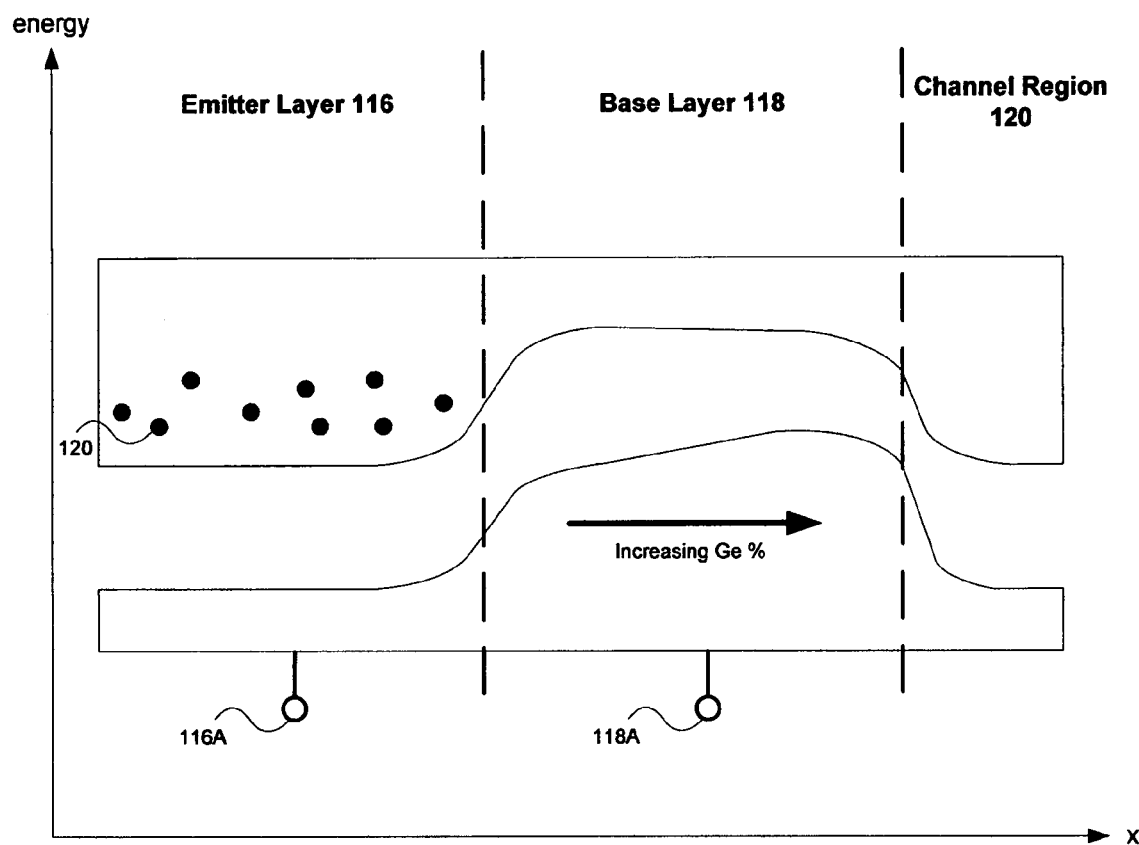
FIG. 1B is an energy level diagram for the hetero-BiMOS injection system of FIG. 1A.

FIG. 1B illustrates the energy levels in the substrate 102 when no external voltages are being applied. In the N+ type emitter layer 116 and channel region 112, conduction can take place by the free movement of electrons 120 in the conduction band. In the P-type base layer 118, conduction can take place by the movement of the free holes (not shown) in the valence band. As shown, however, in the absence of any externally applied voltage, a built in potential barrier forms at the emitter-base junction, therefore few or no charge carriers 120 will move from the emitter layer 116 to the base layer 118.

As mentioned above, the base layer 118 has a germanium concentration gradient across its thickness where the germanium concentration increases towards the channel region 112. As shown in FIG. 1B, the energy gap between the valence band and the conduction band decreases as the germanium content increases, which contributes to an improvement in injection efficiency. Then at the channel region 112, the germanium concentration drops to substantially zero and the energy gap increases.

FIG. 2A illustrates the hetero-BiMOS injection system 100 when it is in operation. Here, a voltage is applied between the control gate terminal 114A and the source region terminal 104A, generating an electric field that creates an inversion layer 200 in the channel region 112. For the MOSFET 101 shown, the inversion layer 200 that is formed is N+ doped during this process.

As noted above, an NPN bipolar transistor requires an N+ doped emitter region, a P doped base region, and an N+ doped collector region. Although the hetero-BiMOS injection system 100 does not include a collector region when no voltages are applied (as shown in FIG. 1A), in accordance with implementations of the invention, when the hetero-BiMOS injection system 100 is operational, the inversion layer 200 functions as an N+ doped collector region. As such, a bipolar transistor 202 is formed within the substrate 102.

To inject charge carriers into the floating gate layer 108, appropriate voltages are applied to the bipolar transistor 202 to turn it "on" and produce a flow of accelerated minority charge carriers that are injected across the lower oxide layer 110 and into the floating gate 108. Because the bipolar transistor in this implementation is an NPN transistor, the minority charge carriers are electrons. In alternate implementations, if a PNP bipolar transistor is used, the minority charge carriers would consist of holes. The bipolar transistor 202 sufficiently accelerates the minority charge carriers to enable them to transition into the floating gate 108 using gate-induced electric fields lower than that required by CHE or conventional Fowler-Nordheim tunneling.

Figure 2B:
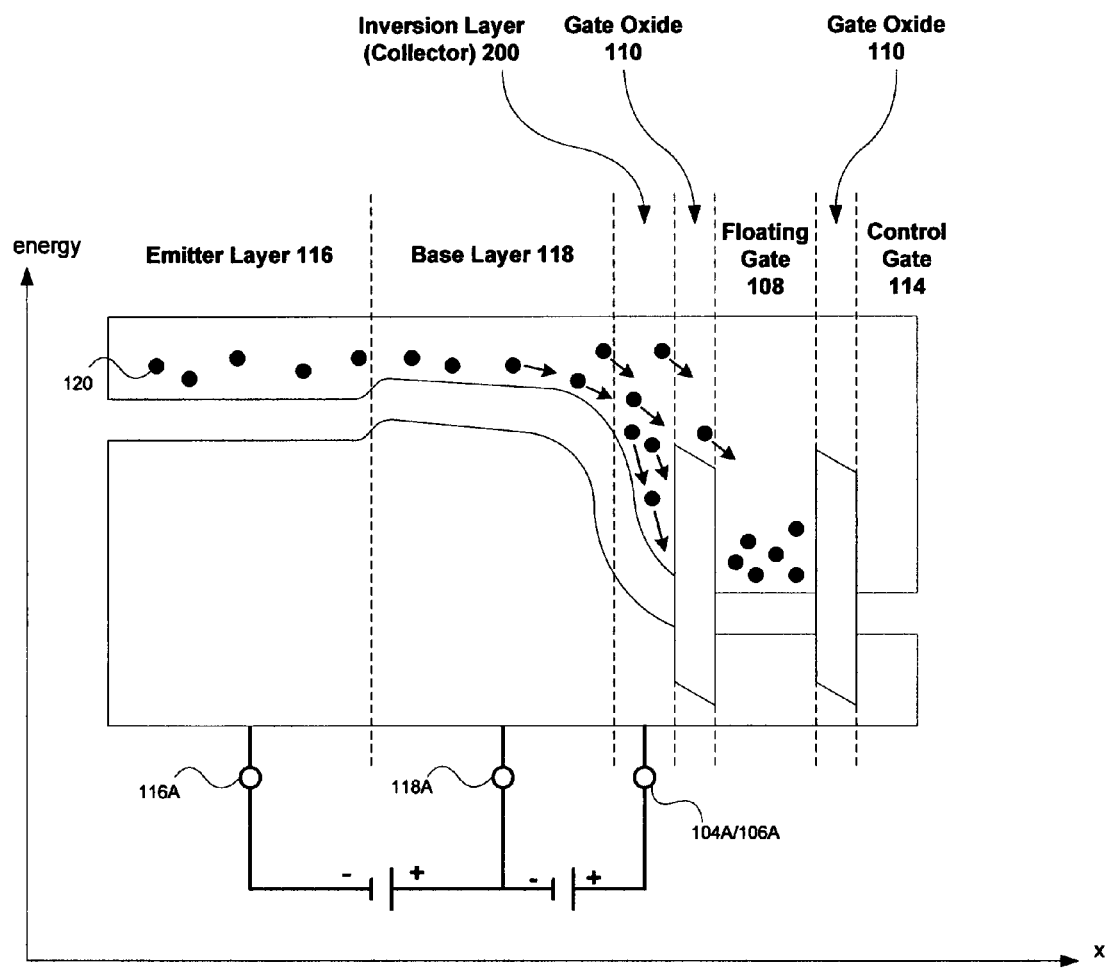
FIG. 2B is an energy level diagram for the hetero-BiMOS injection system of FIG. 2A.

FIG. 2B illustrates energy levels in the substrate 102 when external voltages are applied and the bipolar transistor 202 is operational. At the base-emitter junction (i.e., the interface between the base layer 118 and the emitter layer 116), an appropriate voltage is applied to terminals 118A and 116A to cause the base-emitter junction to be forward-biased. For instance, a voltage is applied such that the terminal 118A is the positive terminal and terminal 116A is the negative terminal. The specific voltage applied is not important as long as the junction is sufficiently forward-biased and the voltage is not too high to cause damage to the transistor 202. The voltage should be high enough, however, that a sufficient number of electrons are injected into the floating gate 108. As shown in FIG. 2B, forward-biasing the base-emitter junction decreases the energy required for electrons 120 in the emitter layer 116 to move into the base layer 118, therefore, electrons 120 in the emitter layer 116 can now flow into the base layer 118.

At the base-collector junction (i.e., the interface between the base layer 118 and the inversion layer 200), an appropriate voltage is applied to cause the base-collector junction to be reverse-biased. The terminals 104A and 106A may be used for the inversion layer 200. For instance, a voltage is applied such that the terminal 118A is the negative terminal and the terminal 104A/106A is the positive terminal. The specific voltage applied is not important as long as the junction is sufficiently reverse-biased and the voltage is not too high to cause damage to the transistor 202. Again, the voltage should be high enough that a sufficient number of electrons are injected into the floating gate 108.

As shown in FIG. 2A, reverse-biasing the base-collector junction causes a depletion region 204 to form at the interface between the base layer 118 and the inversion layer 200. The depletion region 204 also extends to the interface between the base layer 118 and the source and drain regions 104/106. Returning to FIG. 2B, it is shown that reverse-biasing the base-collector junction causes the base layer 118 to have a much higher energy level than the inversion layer 200, thereby causing the electrons 120 to be rapidly swept out of the base layer 118 and into the inversion layer 200 (i.e., the collector region).

At the interface between the inversion layer 200 and the lower gate oxide 110, there is a discontinuity or barrier caused by the gate oxide. In accordance with implementations of the invention, a portion of the electrons 120 have sufficient energy as they move through the inversion layer 200 that they overcome the barrier presented by the gate oxide 110. These electrons 120 are propelled through the lower oxide layer 110 and become trapped in the floating gate 108. The electron injection occurs across the entirety of the inversion layer 200 and is not limited to a small area adjacent to either the source or drain region as is the case for CHE methods.

In alternate implementations of the invention, the independent injection node (i.e., the bipolar transistor 202) may use holes as the minority charge carriers. In such an implementation, the bipolar transistor 202 is a PNP type transistor where the emitter layer 116 is a P+ type layer, the base layer 118 is an N type layer, and the MOSFET uses P+ type source and drain regions 104 and 106. The inversion layer 200 that is created is a P+ type layer, and the bipolar transistor 202 injects holes into the floating gate 108 during the charging cycle.

Accordingly, the bipolar transistor 202 functions as an independent injection node that can inject minority charge carriers into the floating gate much more efficiently than conventional CHE methods. This is because the hetero-BiMOS injection system of the invention increases the charge injection efficiency by using uniform (i.e., across the entire channel region) injection at gate fields lower than that required by CHE or conventional Fowler-Nordheim tunneling. The use of lower gate and drain fields also enables for continued scaling and improved reliability.

Furthermore, the injection methods of the invention do not require the high gate fields and large current flows that CHE methods use. Here, low gate fields can be used to form the inversion layer 200 and less current is needed because the injection process is much more efficient. This enables implementations of the invention to have lower off-state leakage and reduced power dissipation.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be mode to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. A hetero-BiMOS injection system comprising:
   a highly-doped emitter layer that comprises silicon;
   a first terminal coupled to the emitter layer;
   a base layer deposited on the highly-doped emitter layer, wherein the base layer comprises silicon germanium;
   a second terminal coupled to the base layer; and
   a MOSFET transistor formed on the base layer, wherein the MOSFET includes a floating gate.

2. The hetero-BiMOS injection system of claim 1, wherein the highly-doped emitter layer is N+ type and the base layer is P type.

3. The hetero-BiMOS injection system of claim 1, wherein the highly-doped emitter layer is P+ type and the base layer is N type.

4. The hetero-BiMOS injection system of claim 1, wherein the MOSFET transistor comprises:
   a gate stack formed on the base layer, wherein the gate stack includes the floating gate formed between two oxide layers;
   a control gate formed on the gate stack;
   a source region formed in a first portion of the base layer adjacent to the gate stack;
   a drain region formed in a second portion of the base layer adjacent to the gate stack; and
   a third terminal coupled to at least one of the source region and the drain region.

5. The MOSFET transistor of claim 4, wherein:
   the source and drain regions are highly doped N+ type; and
   the floating gate comprises a polysilicon layer, a nitride layer, or a metal layer.

6. The MOSFET transistor of claim 4, wherein:
   the source and drain regions are highly doped P+ type; and
   the floating gate comprises a polysilicon layer, a nitride layer, or a metal layer.

* * * * *